United States Patent
Chou

(10) Patent No.: US 9,553,442 B2
(45) Date of Patent: Jan. 24, 2017

(54) POWER CONTROL DEVICE WITH MULTI-DIRECTIONAL SENSING ABILITY

(71) Applicant: Tien-Ming Chou, Taichung (TW)

(72) Inventor: Tien-Ming Chou, Taichung (TW)

( * ) Notice: Subject to any disclaimer, the term of this patent is extended or adjusted under 35 U.S.C. 154(b) by 254 days.

(21) Appl. No.: 14/456,249

(22) Filed: Aug. 11, 2014

(65) Prior Publication Data
US 2014/0346899 A1    Nov. 27, 2014

Related U.S. Application Data

(63) Continuation-in-part of application No. 13/562,933, filed on Jul. 31, 2012, now Pat. No. 8,916,814.

(51) Int. Cl.
| | |
|---|---|
| H02H 7/20 | (2006.01) |
| H02H 5/00 | (2006.01) |
| H03K 17/968 | (2006.01) |
| D06F 75/26 | (2006.01) |
| H01H 35/02 | (2006.01) |

(52) U.S. Cl.
CPC .............. *H02H 5/00* (2013.01); *D06F 75/26* (2013.01); *H03K 17/968* (2013.01); *H01H 35/025* (2013.01); *H01H 2231/012* (2013.01)

(58) Field of Classification Search
CPC ............ Y10T 307/786; Y10T 307/793; Y10T 307/799; Y10T 307/806
USPC ................... 307/326–328, 119–122
See application file for complete search history.

(56) References Cited

U.S. PATENT DOCUMENTS

| | | | |
|---|---|---|---|
| 5,373,153 A | 12/1994 | Cumberledge et al. | |
| 5,637,931 A * | 6/1997 | Hsu | D06F 75/26 307/119 |
| 5,751,074 A * | 5/1998 | Prior | H01H 29/002 307/118 |
| 5,966,851 A * | 10/1999 | Serpa | D06F 75/38 38/77.7 |
| 9,396,434 B2 * | 7/2016 | Rothkopf | G06F 1/1626 |
| 2014/0034814 A1 | 2/2014 | Chou | |

FOREIGN PATENT DOCUMENTS

TW    M430068 U    5/2012

* cited by examiner

*Primary Examiner* — Fritz M Fleming
(74) *Attorney, Agent, or Firm* — McNees Wallace & Nurick LLC

(57) ABSTRACT

A power control device includes an electric power switch and a control unit. The control unit is mounted on an electric device, determines whether the electric device is disposed at a normal use position or an abnormal inclined position, and determines whether the electric device is at a normal use state and is disposed at the normal use position. The control unit controls the electric power switch to provide electric power to the electric device when the electric device is at the normal use state, and to stop providing the electric power to the electric device when the electric device is at the abnormal inclined position.

13 Claims, 12 Drawing Sheets

POWER CONTROL DEVICE WITH MULTI-DIRECTIONAL SENSING ABILITY

CROSS-REFERENCE TO RELATED APPLICATION

This application is a continuation-in-part (CIP) of U.S. patent application Ser. No. 13/562,933, filed on Jul. 31, 2012.

FIELD OF THE INVENTION

The invention relates to a power control device, more particularly to a power control device with a multi-directional sensing ability for controlling electricity supply to an electric device.

DESCRIPTION OF THE RELATED ART

Generally, a power control device of an electric device employs a conventional sensor switch that may detect a use position and a non-use position of the electric device. The power control device cuts off electric power provided to the electric device when it is determined via the conventional sensor switch that the electric device is disposed at the non-use position. However, the conventional sensor switch is not capable of detecting abnormal inclined positions of the electric device, such as inclined or upside down, and the power control device may continuously provide the electric power to the electric device at such position, which may increase the risk of accidents. Further, the conventional sensor switch is not capable of detecting a normal use state of the electric device, such that the power control device may continuously provide the electric power to the electric device even though the electric device is operated inappropriately.

SUMMARY OF THE INVENTION

Therefore, an object of the present invention is to provide a power control device with multi-directional sensing ability that provides electric power to an electric device when the electric device is disposed at a particular position and that may alleviate the above drawbacks of the prior art.

According to this invention, a power control device with multi-directional sensing ability for controlling electricity supply to an electric device is disclosed. The power control device comprises an electric power switch and a control unit. The electric power switch is for receiving electric power, and is operable to provide the electric power to the electric device. The control unit includes a multi-directional sensor switch and a control circuit. The multi-directional sensor switch is configured to be mounted on the electric device, and is operable to determine whether the electric device is disposed at a normal use position or at an abnormal inclined position, to determine whether the electric device is at a normal use state when the electric device is disposed at the normal use position, to output a power-supply signal when the electric device is at the normal use state, and to output a power-off signal when the electric device is disposed at the abnormal inclined position. The control circuit is electrically connected to the multi-directional sensor switch for receiving the power-supply signal and the power-off signal, and is operable to control the electric power switch to provide the electric power to the electric device in response to receipt of the power-supply signal and to control said electric power switch to stop providing the electric power according to the power-off signal.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
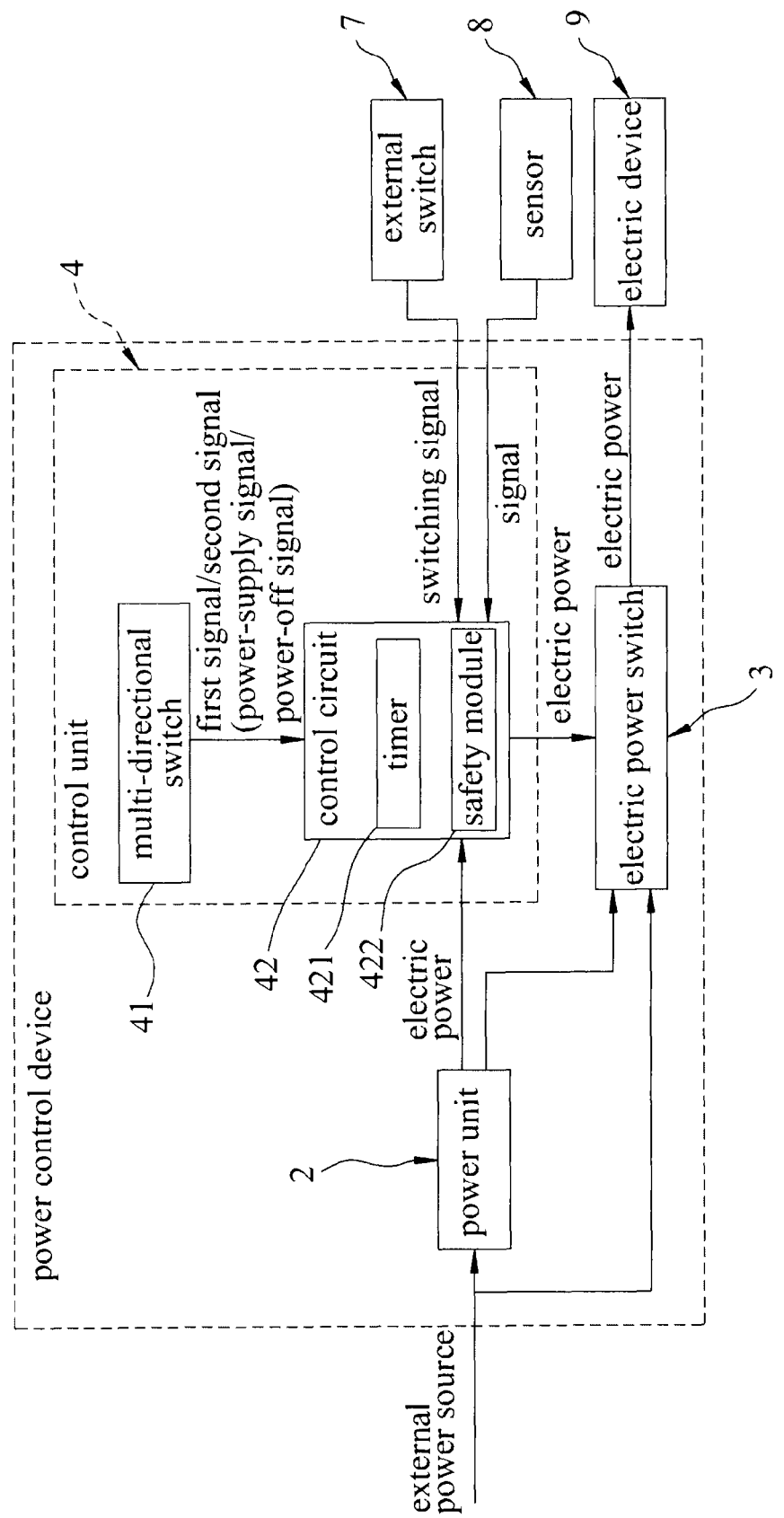
FIG. 1 is a block diagram of a preferred embodiment of a power control device with multi-directional sensing ability according to the present invention.

Referring to FIG. 1, a power control device with multi-directional sensing ability for controlling electricity supply to an electric device 9 according to the preferred embodiment of this invention is shown. The power control device includes a power unit 2, an electric power switch 3 and a control unit 4.

The power unit 2 is for receiving external power from an external power source and for converting the external power into electric power, and is electrically connected to the electric power switch 3 to provide the electric power thereto.

The electric power switch 3 is for receiving the electric power, and is operable to provide the electric power to the electric device 9. Note that the electric power switch 3 may be implemented using one of a relay, a tri-electrode AC switch (TRIAC), a silicon controlled rectifier (SCR), a solid state relay (SSR), an insulated gate bipolar transistor (IGBT) or any combination thereof, and should not be limited to what is disclosed herein. It should be further noted that, in other embodiments of this invention, the electric power switch 3 may directly receive the electric power from an appropriate electric power source and the power unit 2 may thus be omitted.

Figure 7:
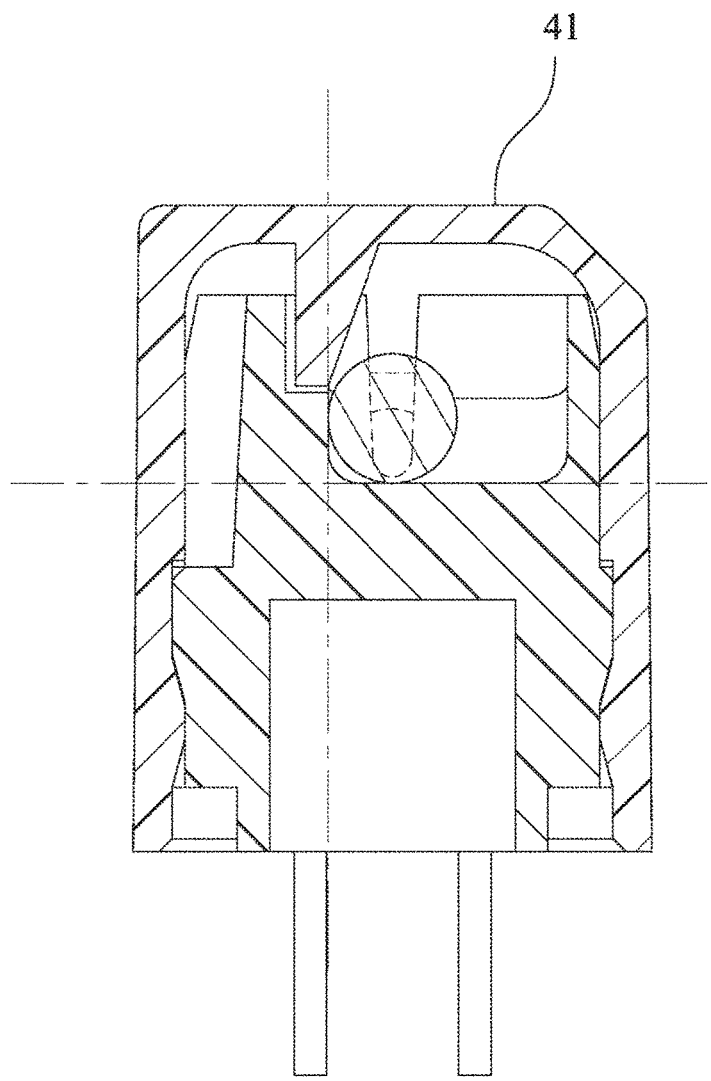
FIG. 7 is a sectional view of a multi-directional sensor switch disclosed in Taiwanese Utility Model No. M430068.
Figure 8:
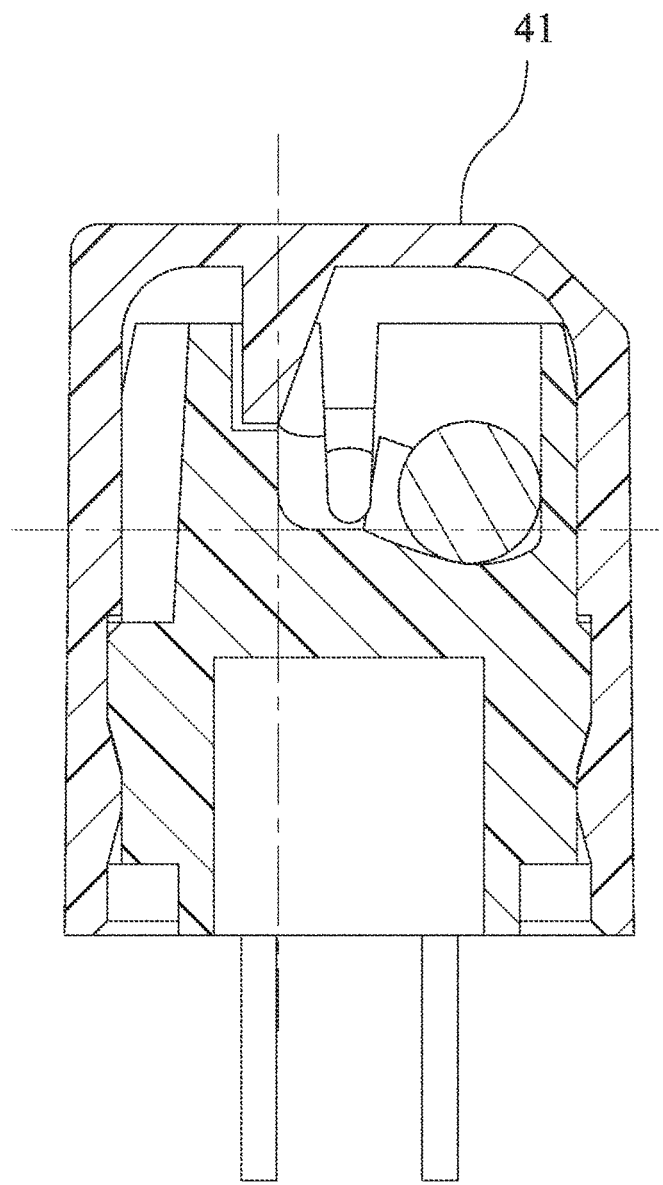
FIG. 8 is a sectional view of a modified multi-directional sensor switch disclosed in Taiwanese Utility Model No. M430068.

The control unit 4 includes a multi-directional sensor switch 41 and a control circuit 42. As shown in FIGS. 7 and 8, a multi-directional sensor switch and a modification thereof disclosed in Taiwanese Utility Model No. M430068 may be employed as the multi-directional sensor switch 41 in this embodiment. The control circuit 42 is electrically connected to the power unit 2 to receive the electric power therefrom.

Figure 2:
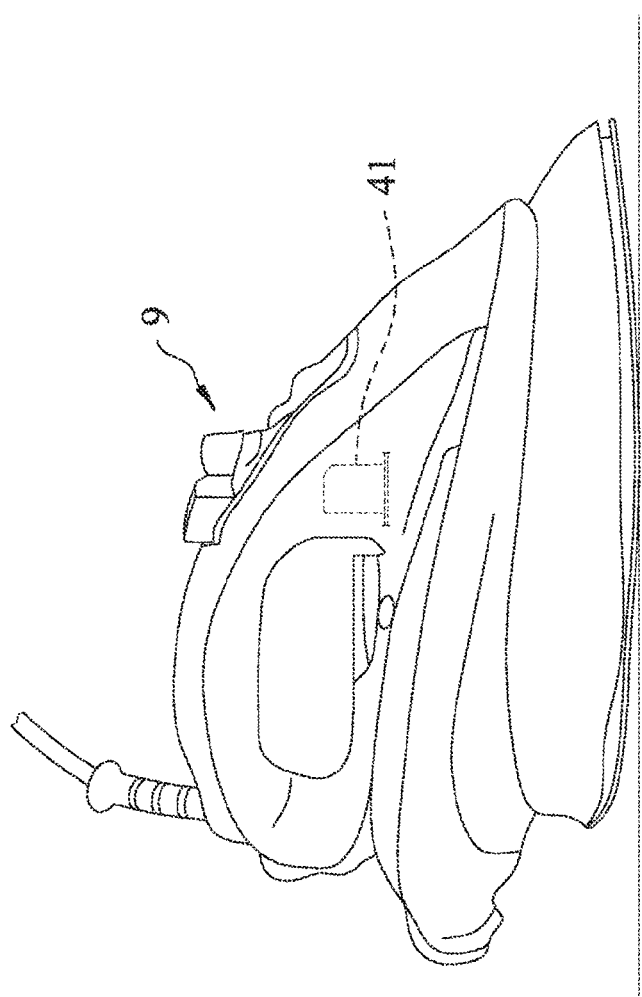
FIGS. 2 to 6 illustrate an electric iron mounted with the power control device being disposed in different positions.

The multi-directional sensor switch 41 is mounted on the electric device 9, and is operable to determine whether the electric device 9 is disposed at a normal use position or at an abnormal inclined position. The multi-directional sensor switch 41 is further operable to determine whether the electric device 9 is at a normal use state when the electric device 9 is disposed at the normal use position. When it is determined that the electric device 9 is at the normal use state, the multi-directional sensor switch 41 outputs a power-supply signal. When it is determined that the electric device 9 is disposed at the abnormal inclined position, the multi-directional sensor switch 41 outputs a power-off signal. In this embodiment, the electric device 9 is an electric iron (see FIG. 2), and the multi-directional sensor switch 41 determines that the electric device 9 is at the normal use state when the electric device 9 is disposed at the normal use position and is moved to and fro, and outputs different first and second signals alternately as the power-supply signal in response to reciprocating movement of the electric device 9.

The control circuit 42 is electrically connected to the multi-directional sensor switch 41 for receiving the power-supply signal and the power-off signal. The control circuit 42 is operable to control the electric power switch 3 to provide the electric power to the electric device 9 in response to receipt of the first and second signals (i.e., the power-supply signal) alternately within a predetermined time period. The control circuit 42 is further operable to control the electric power switch 3 to stop providing the electric power according to the power-off signal.

Figure 6:
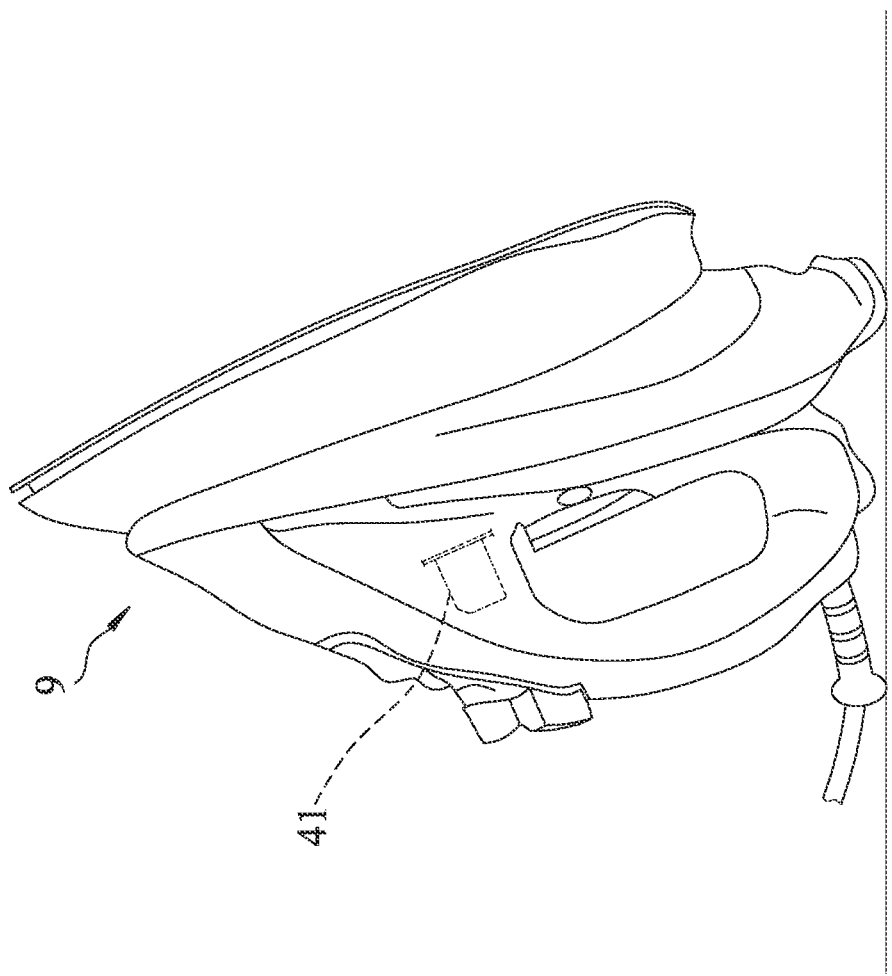

The multi-directional sensor switch 41 is further operable to determine whether the electric device 9 is disposed at a standby position as shown in FIG. 6, and to output a standby signal when the electric device 9 is disposed at the standby position. The control circuit 42 further controls the electric power switch 3 to stop providing the electric power to the electric device 9 when the control circuit 42 continuously receives the standby signal for a first predetermined time period.

Additionally, the control circuit 42 controls the electric power switch 3 to stop providing the electric power to the electric device 9 when the control circuit 42 continuously receives the power-off signal for a second predetermined time period that is shorter than the first predetermined time period.

The control circuit 42 includes a timer 421 and a safety module 422 in this embodiment. The timer 421 is for timing continuous receipt of one of the standby signal and the power-off signal. When the control circuit 42 receives another one of the standby signal and the power-off signal, the timer 421 is operable to restart timing continuous receipt of said another one of the standby signal and the power-off signal.

The control circuit 42 is operable to actuate the safety module 422 for disabling the electric power switch 3 for providing the electric power to the electric device 9 according to the power-off signal, and to disable the safety module 422 for enabling the electric power switch 3 to provide the electric power to the electric device 9 upon receipt of a user input of a switch signal from a user-operable switch 7. The user-operable switch 7 may be implemented using a start switch, a reset switch and the like, and the invention is not limited in this respect. The timer 421 and the safety module 422 may be implemented using hardware, software, or combinations thereof.

Additionally, the control circuit 42 controls the electric power switch 3 whether or not to provide the electric power to the electric device 9 according to the user input of the switch signal for the user-operable switch 7. The control circuit 42 further controls the electric power switch 3 to stop providing the electric power according to a signal generated by a sensor 8. The sensor 8 may be one of a thermometer, a hygrometer, an illuminometer, a vibration meter, a smoke detector, etc.

It should be further noted that the above mentioned components of the power control device except for the multi-directional sensor switch 41 may be external to the electric device 9 and the above mentioned signals may be transceived wirelessly.

In the case that the electric device 9 is the electric iron, and one of the multi-directional sensor switches shown in FIGS. 7 and 8 is employed as the multi-directional sensor switch 41, the multi-directional sensor switch 41 outputs the standby signal when the electric device 9 (iron) is disposed at the standby position shown in FIG. 6. When the control circuit 42 continuously receives the standby signal for the first predetermined time period, e.g., a few minutes, the electric power switch 3 is controlled by the control circuit 42 to stop providing the electric power to the electric device 9.

When it is determined that the electric device 9 (iron) is disposed at the normal use state (FIG. 2) and is moved to and fro, the multi-directional sensor switch 41 outputs the first and second signals as the power-supply signal alternately to the control circuit 42. The electric power switch 3 is then controlled by the control circuit 42 to provide the electric power to heat up the electric device 9 (iron) in response to receipt of the first and second signals alternatively by the control circuit 42 within a predetermined time period, e.g., a few seconds.

Figure 3:
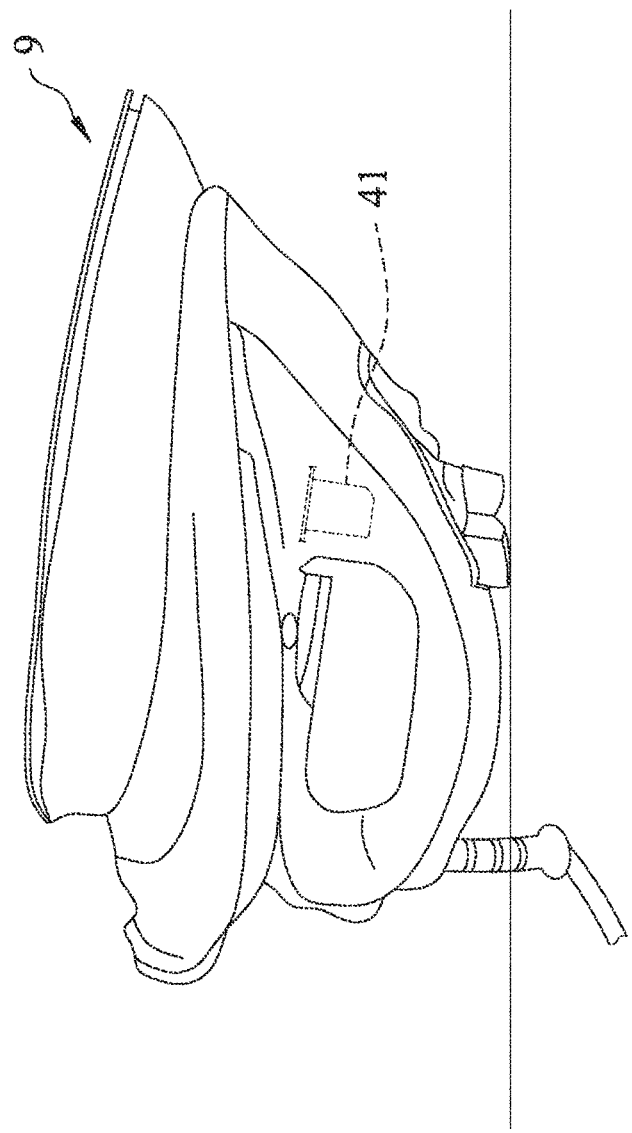
Figure 4:
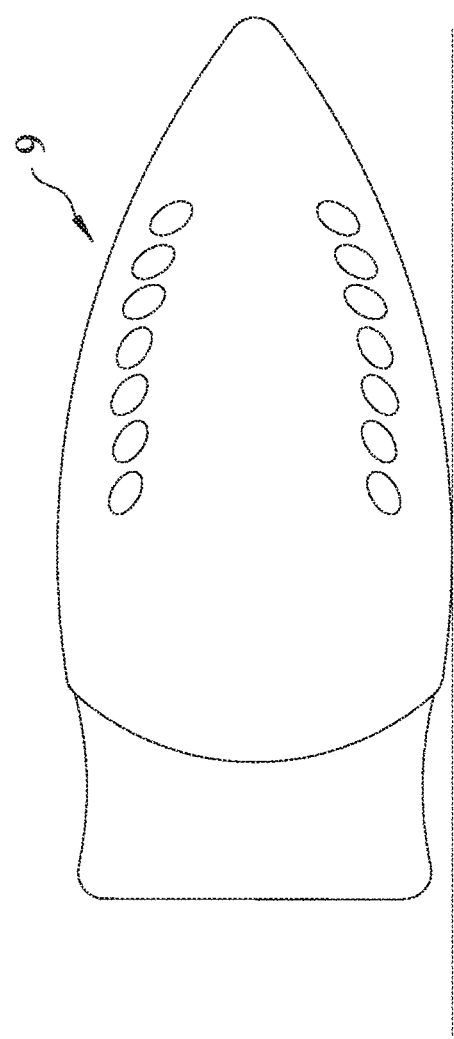
Figure 5:
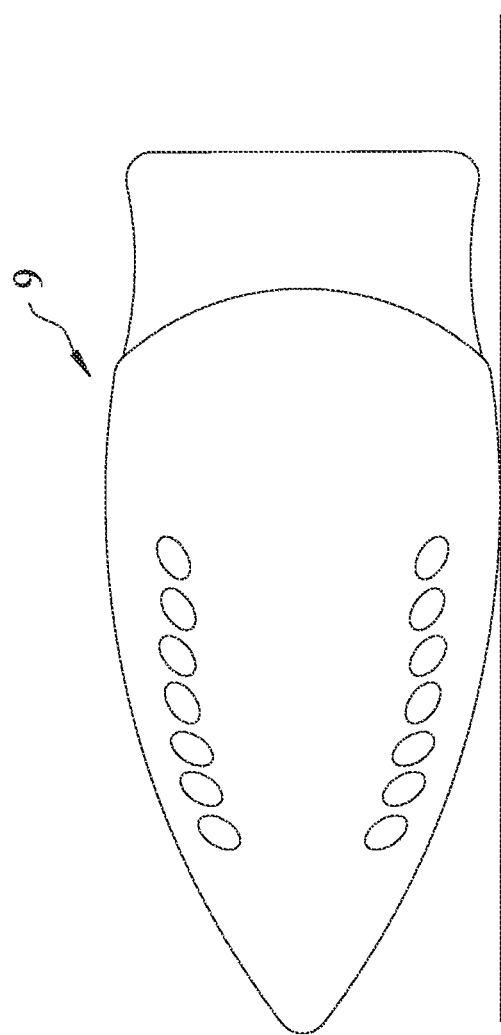

Furthermore, when the electric device 9 is disposed at any of the abnormal inclined positions shown in FIGS. 3 to 5, the multi-directional sensor switch 41 outputs the power-off signal. Specifically, the multi-directional sensor switch 41 outputs the power-off signal when the electric device 9 (iron) is inclined from the standby position (FIG. 6) sideward beyond a first predetermined angle ranging from 25° to 65°, preferably 45°, backward beyond a second predetermined angle ranging from 0° to 80°, preferably 0° to 20°, or frontward to the normal use position beyond a third predetermined angle ranging from 70° to 110°, preferably 70° to 90°.

The control circuit 42 controls the electric power switch 3 to stop providing the electric power to the electric device 9 when the control circuit 42 continuously receives the power-off signal for the second predetermined time period, e.g., tens of seconds.

Figure 9:
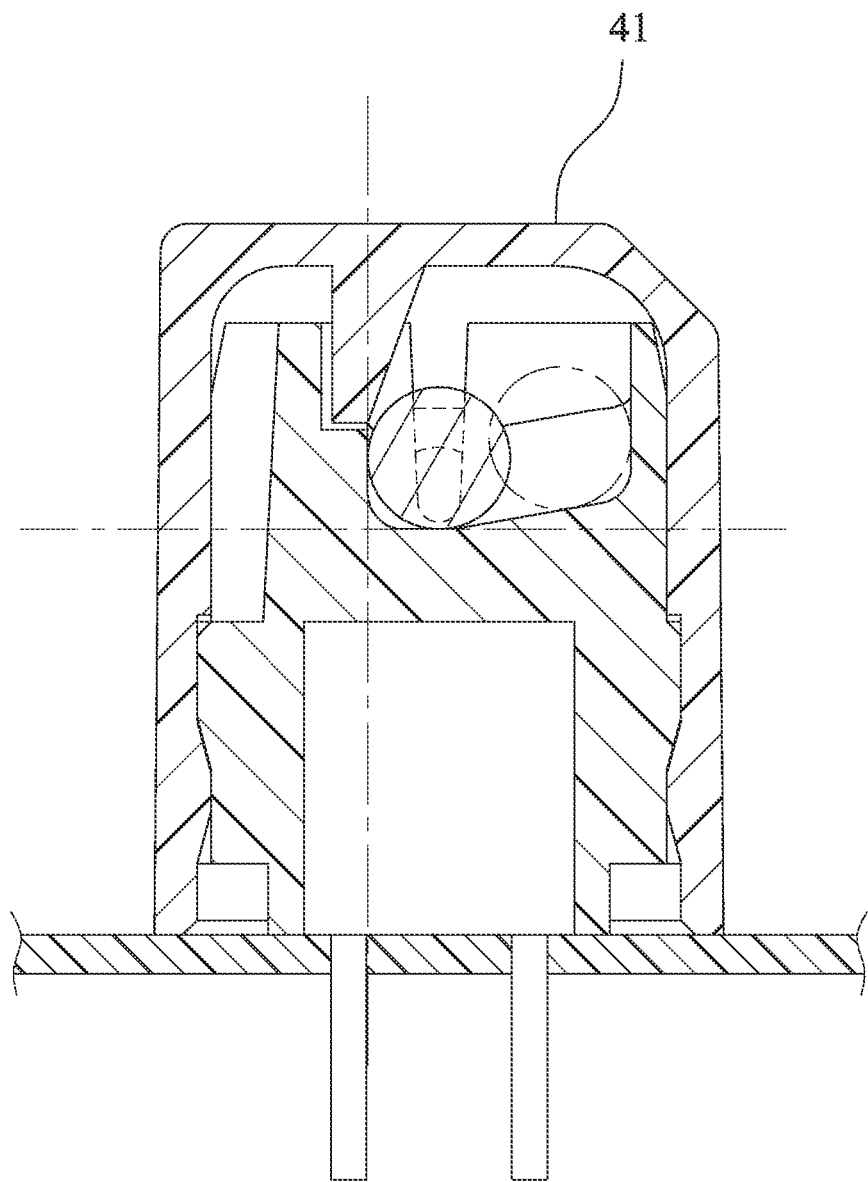
FIG. 9 is a sectional view of another modified multi-directional sensor switch disclosed in Taiwanese Utility Model No. M430068.
Figure 10:
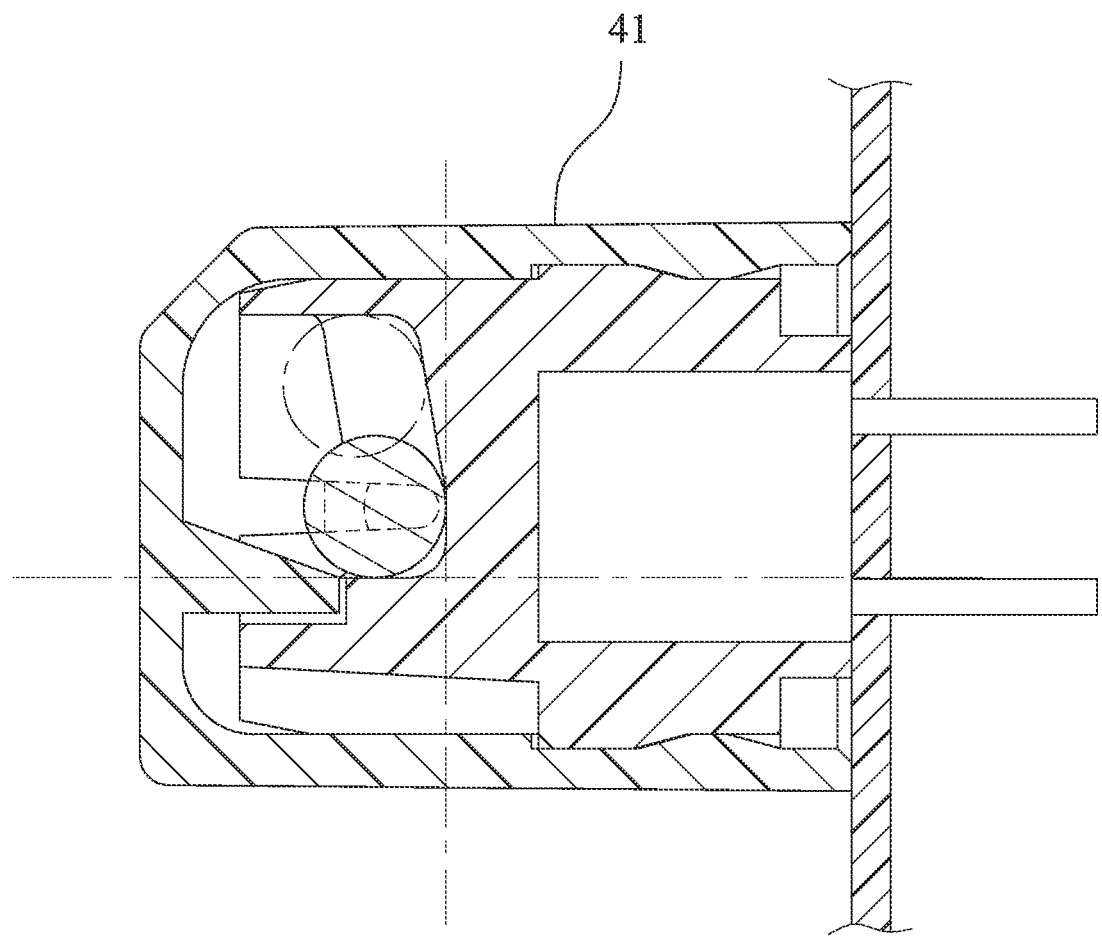
FIG. 10 is a sectional view of the multi-directional sensor switch shown in FIG. 9 being disposed in another position.

FIGS. 9 and 10 illustrate another modification of the multi-directional sensor switch disclosed in Taiwanese Utility Model No. M430068 being disposed in different positions. In the case that the electric device 9 is the electric iron and the multi-directional sensor switch shown in FIGS. 9 and 10 is employed as the multi-directional sensor switch 41, the multi-directional sensor switch 41 outputs the power-supply signal when the electric device 9 (iron) is disposed at the normal use position or the standby position, and outputs the power-off signal when the electric device 9 is disposed at any of the abnormal inclined positions. Further, the third predetermined angle ranges from 90° to 110° in this implementation.

Figure 11:
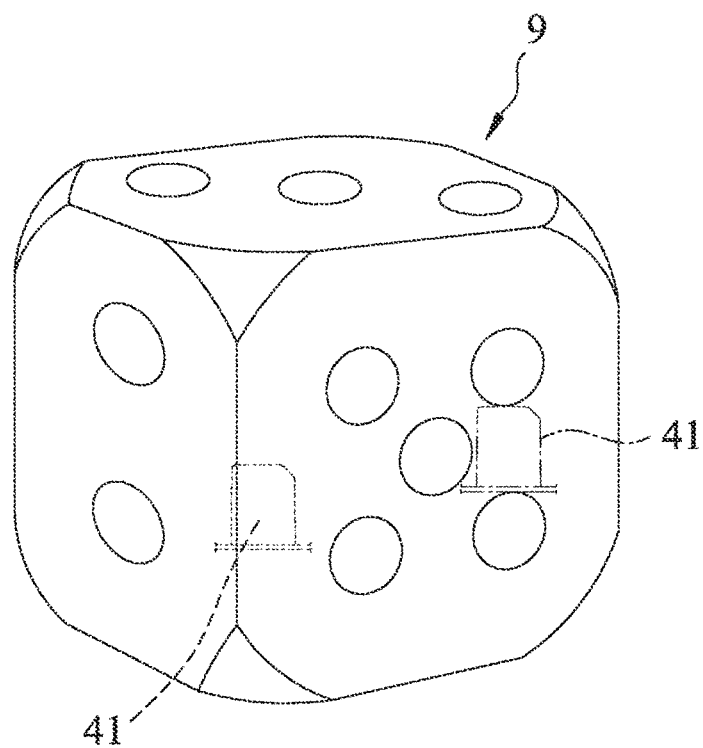
FIG. 11 is a schematic perspective view of a dice incorporating the power control device of the preferred embodiment.

Referring to FIG. 11, two of the power control devices are mounted on a dice to respectively control light emission and sound output. When the multi-directional sensor switch 41 of one of the power control devices determines the dice as being disposed at any of selected two of six surfaces of the dice and outputs the power-supply signal, the control circuit 42 of said one of the power control devices controls, in response to receipt of the power-supply signal, the electric power switch 3 to provide electric power to the dice so as to enable the dice to output sound. Similarly, when it is determined that the dice is disposed at any of the remaining four surfaces, the control circuit 42 of the other one of the power control devices controls the electric power switch 3 to provide electric power to the dice so as to enable the dice to emit light.

Figure 12:
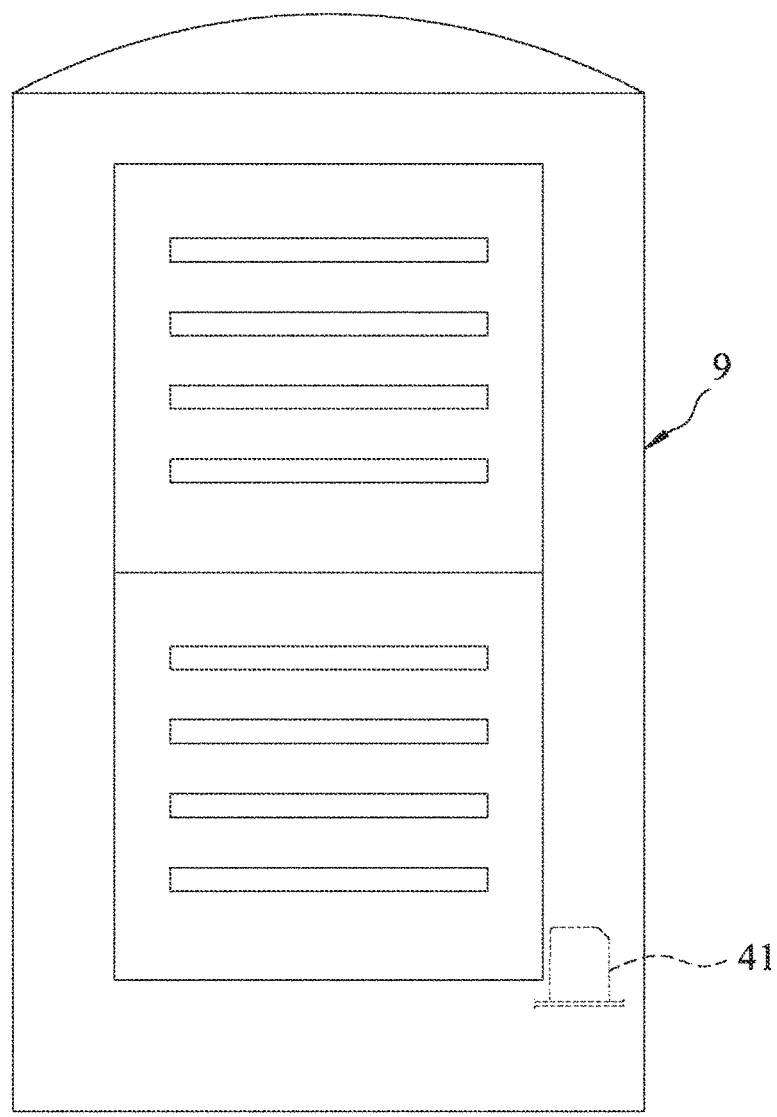
FIG. 12 is a schematic perspective view of an electric heater incorporating the power control device of the preferred embodiment.

Referring to FIG. 12, in a case that the electric device 9 is an electric heater, the multi-directional sensor switch 41 determines that the heater is at the normal use state when the electric heater is disposed at the normal use position without movement, and outputs one of the first and second signals as the power-supply signal. Accordingly, the electric power switch 3 is controlled by the control circuit 42 to provide the electricity to the heater.

In summary, by virtue of the multi-directional sensor switch 41, it is possible to determine whether the electric device 9 is at the normal use state, the normal use position, or any of the abnormal inclined positions, and the multi-directional sensor switch 41 is operable to output the power-supply signal or the power-off signal so that the control circuit 42 is operable to control the electric power switch 3 whether or not to provide the electric power to the electric device 9. By this way, the electric power provided to the electric device 9 can be cut off timely to thereby decrease the risk of accident in case the electric device 9 is disposed at an inclined abnormal position or is being used inappropriately. Further, the multi-directional sensor switch 41 can be mounted on various electric devices, and can be remote controlled by the control circuits 42 to thereby increase usability of the power control device.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A power control device with multi-directional sensing ability for controlling electricity supply to an electric device, said power control device comprising:
   an electric power switch for receiving an electric power, and being operable to provide the electric power to the electric device; and
   a control unit that includes
      a multi-directional sensor switch configured to be mounted on the electric device, and being operable to determine whether the electric device is disposed at one of a normal use position and an abnormal inclined position, to determine whether the electric device is at a normal use state when the electric device is disposed at the normal use position, to output a power-supply signal when the electric device is at the normal use state, and to output a power-off signal when the electric device is disposed at the abnormal inclined position, and
      a control circuit electrically connected to said multi-directional sensor switch for receiving the power-supply signal and the power-off signal, and operable to control said electric power switch to provide the electric power to the electric device in response to receipt of the power-supply signal and to control said electric power switch to stop providing the electric power according to the power-off signal;

wherein said multi-directional sensor switch is further operable to determine whether the electric device is disposed at a standby position, and to output a standby signal when the electric device is disposed at the standby position,
      wherein said control circuit further controls said electric power switch to stop providing the electric power to the electric device when said control circuit continuously receives the standby signal for a first predetermined time period; and
      wherein said multi-directional sensor switch outputs the power-off signal when the electric device is inclined from the standby position, backward beyond a first predetermined angle or frontward to the normal use position beyond a second predetermined angle.

2. The power control device as claimed in claim 1, wherein said multi-directional sensor switch is operable to determine that the electric device is at the normal use state when the electric device is disposed at the normal use position and is moved to and fro, and to output different first and second signals alternately as the power-supply signal in response to reciprocating movement of the electric device, and
   wherein said control circuit is operable to control said electric power switch to provide the electric power to the electric device when said control circuit receives the first and second signals alternately within a predetermined time period.

3. The power control device as claimed in claim 2, wherein said multi-directional sensor switch is operable to determine that the electric device is at the normal use state when the electric device is disposed at the normal use position without movement, and to output one of the first and second signals as the power-supply signal.

4. The power control device as claimed in claim 1, wherein said control circuit controls said electric power switch to stop providing the electric power to the electric device when said control circuit continuously receives the power-off signal for a second predetermined time period that is shorter than the first predetermined time period.

5. The power control device as claimed in claim 4, wherein said control circuit includes a timer for timing continuous receipt of one of the standby signal and the power-off signal.

6. The power control device as claimed in claim 5, wherein, when said control circuit receives another one of the standby signal and the power-off signal, said timer is operable to restart timing continuous receipt of said another one of the standby signal and the power-off signal.

7. The power control device as claimed in claim 1, wherein the first predetermined angle ranges from 0° to 80°.

8. The power control device as claimed in claim 1, wherein the second predetermined angle ranges from 70° to 110°.

9. The power control device as claimed in claim 1, wherein said control circuit is operable to control said electric power switch according to a user input of a switch signal.

10. The power control device as claimed in claim 1, wherein said control circuit is operable to control said electric power switch according to a signal generated by a sensor.

11. The power control device as claimed in claim 10, wherein the sensor is one of a thermometer, a hygrometer, an illuminometer, a vibration meter, and a smoke detector.

12. The power control device as claimed in claim 1, further comprising a power unit for receiving external power and for converting the external power into the electric power, said power unit being electrically connected to said control circuit and said electric power switch to provide the electric power thereto.

13. The power control device as claimed in claim 1, wherein said control circuit includes a safety module, and is operable to actuate said safety module for disabling said electric power switch for providing the electric power to the electric device according to the power-off signal, and to disable said safety module for enabling said electric power switch to provide the electric power to the electric device upon receipt of a user input of a switch signal.

* * * * *